United States Patent
Morishita et al.

(10) Patent No.: US 9,410,082 B2
(45) Date of Patent: Aug. 9, 2016

(54) SEMICONDUCTOR PHOSPHOR NANOPARTICLE AND LIGHT-EMITTING DEVICE INCLUDING THE SAME

(71) Applicant: Sharp Kabushiki Kaisha, Osaka-shi, Osaka (JP)

(72) Inventors: Mami Morishita, Osaka (JP); Tatsuya Ryohwa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/534,440

(22) Filed: Nov. 6, 2014

(65) Prior Publication Data

US 2015/0144867 A1    May 28, 2015

(30) Foreign Application Priority Data

Nov. 25, 2013    (JP) ................. 2013-242530

(51) Int. Cl.
| | |
|---|---|
| *H01L 33/06* | (2010.01) |
| *C09K 11/62* | (2006.01) |
| *C09K 11/02* | (2006.01) |
| *C09K 11/70* | (2006.01) |
| *C09K 11/88* | (2006.01) |
| *H01L 33/50* | (2010.01) |

(52) U.S. Cl.
CPC ............... *C09K 11/62* (2013.01); *C09K 11/025* (2013.01); *C09K 11/70* (2013.01); *C09K 11/883* (2013.01); *H01L 33/502* (2013.01)

(58) Field of Classification Search
CPC .............................. C09K 11/02; C09K 11/025
USPC ........................................................ 252/301.36
See application file for complete search history.

(56) References Cited

U.S. PATENT DOCUMENTS 9,196,682 B2 * 11/2015 Jang ........................ B82Y 10/00
2010/0252778 A1    10/2010 Murase et al.

FOREIGN PATENT DOCUMENTS

WO    2009/028282 A1    3/2009

* cited by examiner

*Primary Examiner* — Mark Prenty
(74) *Attorney, Agent, or Firm* — Keating & Bennett, LLP

(57) ABSTRACT

A semiconductor phosphor nanoparticle includes a semiconductor nanoparticle and a first organic compound. An end of the first organic compound is bonded to a surface of the semiconductor nanoparticle, and the other end of the first organic compound is polymerized to form a first inorganic layer.

5 Claims, 3 Drawing Sheets

SEMICONDUCTOR PHOSPHOR NANOPARTICLE AND LIGHT-EMITTING DEVICE INCLUDING THE SAME

BACKGROUND

1. Field

The present disclosure relates to a semiconductor phosphor nanoparticle and a light-emitting device that includes the semiconductor phosphor nanoparticle and specifically to a semiconductor phosphor nanoparticle that has a protected surface and a light-emitting device that includes such a semiconductor phosphor nanoparticle.

2. Description of the Related Art

It is known that a quantum size effect is observed when the size of semiconductor nanoparticles is as small as an exciton Bohr radius. A quantum size effect refers to a phenomenon in which, when the size of a substance is reduced, electrons in the substance cannot freely move and cannot have arbitrary energy but a specific energy. It is also known that a change in the size of semiconductor nanoparticles in which electrons are confined causes a change in the energy state of the electrons, that is, the smaller the size of semiconductor nanoparticles, the shorter the wavelength of the light emitted from the semiconductor nanoparticles. The application of semiconductor nanoparticles, which exhibit the quantum size effect described above, as phosphors has been focused on and studied.

Since semiconductor nanoparticles that exhibit a quantum size effect have a small particle size, the specific surface area of the semiconductor nanoparticles is large. Therefore, surface defects of semiconductor nanoparticles greatly affect the luminescence intensity of a phosphor. Furthermore, if the surfaces of semiconductor nanoparticles are subjected to oxidation or the like, the overall chemical stability of the semiconductor nanoparticles may be impaired.

In order to enhance the chemical stability of semiconductor nanoparticles and to achieve high luminescence intensity, for example, there has been proposed a technique in which a coating layer is formed on the surface of semiconductor nanoparticle.

International Publication No. WO2009/028282 discloses a luminescent material having increased luminous efficiency, a narrowed luminescent spectral band width, and enhanced chemical durability, which is produced by, in a surface treatment of semiconductor nanoparticles capable of emitting light, reducing the insufficiency of the surface conditions of the semiconductor nanoparticles which is due to a mismatch in lattice constants or steric hindrance, which has been unavoidably caused in the related art. Specifically, a luminescent material that includes semiconductor nanoparticles having an average particle diameter of 2 nanometers or more and 12 nanometers or less and a band gap of 3.8 electron-volts or less, the semiconductor nanoparticles each being coated with a layer including silicon, is disclosed. The peak luminous wavelength of the semiconductor nanoparticles included in the luminescent material is 20 nanometers or more greater than the peak luminous wavelength of the semiconductor nanoparticles when not included in the luminescent material.

SUMMARY

However, in International Publication No. WO2009/028282, since the layer including silicon is formed directly on the surface of the semiconductor nanoparticle, a mismatch in the lattice constants between the layer including silicon and the semiconductor nanoparticle causes a strain in the crystal lattice at the surface of the semiconductor nanoparticle, which leads to a reduction in luminous efficiency.

Accordingly, the present disclosure provides a semiconductor phosphor nanoparticle that has improved chemical stability and high luminous efficiency and a light-emitting device that includes the semiconductor phosphor nanoparticle.

According to an aspect of the disclosure, there is provided a semiconductor phosphor nanoparticle including a semiconductor nanoparticle and a first organic compound. An end of the first organic compound is bonded to a surface of the semiconductor nanoparticle, and another end of the first organic compound is polymerized to form a first inorganic layer.

According to another aspect of the disclosure, there is provided a light-emitting device including an wavelength conversion unit including a transparent member and semiconductor phosphor nanoparticles dispersed in the transparent member. The content of the semiconductor phosphor nanoparticles in the wavelength conversion unit is 0.001% by weight or more and 10% by weight or less relative to 100% by weight of the total weight of the transparent member and the semiconductor phosphor nanoparticles. The semiconductor phosphor nanoparticles each include a semiconductor nanoparticle and a first organic compound. An end of the first organic compound is bonded to a surface of the semiconductor nanoparticle, and another end of the first organic compound is polymerized to form a first inorganic layer.

DESCRIPTION OF THE EMBODIMENTS

Figure 1:
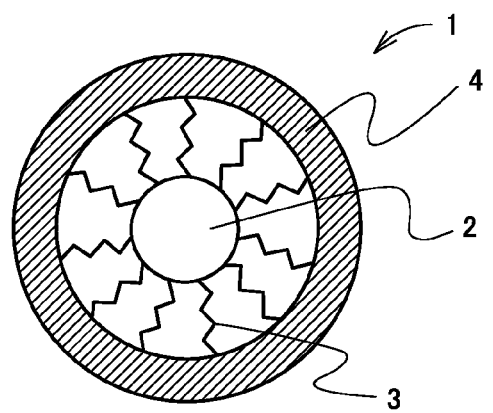
FIG. 1 is a schematic cross-sectional view of a semiconductor phosphor nanoparticle according to an embodiment of the present disclosure.

Through the drawings attached to the present application, the same reference numerals represent the same or corresponding components. Dimensions in the drawings, such as length, size, and width, are changed appropriately for the purposes of clarification and simplification of the drawings and are not actual dimensions.

Embodiment 1

A semiconductor phosphor nanoparticle according to an embodiment of the present disclosure is described below with reference to FIG. 1.

In FIG. 1, a semiconductor phosphor nanoparticle 1 includes a semiconductor nanoparticle 2 and a plural number of first organic compounds 3. An end of each first organic compound 3 is bonded to the surface of the semiconductor nanoparticle 2. The other ends are polymerized together to form a first inorganic layer 4.

In the semiconductor phosphor nanoparticle according to the embodiment, the semiconductor nanoparticle is coated with the first inorganic layer with the main chains of the first organic compounds interposed between the semiconductor nanoparticle and the first inorganic layer. This suppresses occurrence of a mismatch in the lattice constants between the semiconductor nanoparticle and a coating layer at the interface therebetween in the semiconductor phosphor nanoparticle, which occurs when the coating layer is formed directly on the surface of the semiconductor nanoparticle. This allows the semiconductor phosphor nanoparticle to maintain high luminous efficiency.

Semiconductor Nanoparticle

The semiconductor nanoparticles may be provided as monosized phosphor particles such that scattering of visible light (380 to 780 nm) by the monosized phosphor particles is suppressed.

The semiconductor nanoparticles may be, for example, InN-based semiconductor nanoparticles. The band gap of InN particles can be controlled within a range corresponding to colors from blue to red by reducing the particle size (nanocrystallization) of the InN particles due to a quantum effect.

Alternatively, the semiconductor nanoparticles may be semiconductor nanoparticles that are made of a Group III-V compound semiconductor other than InN or a Group II-VI compound semiconductor. Examples of binary semiconductor nanoparticles that are made of a Group II-VI compound semiconductor include CdS, CdSe, CdTe, ZnS, ZnSe, ZnTe, HgS, HgSe, HgTe, PbSe, and PbS. Examples of binary semiconductor nanoparticles that are made of a Group III-V compound semiconductor include GaN, GaP, GaAs, AlN, Alp, AlAs, InN, InP, and InAs.

Examples of ternary and quaternary semiconductor nanoparticles include CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, InGaN, GaAlNP, GaAlNAs, GaAlPAs, GaInNP, GaInNAs, GaInPAs, InAlNP, InAlNAs, and InAlPAs.

Among the above-described semiconductor nanoparticles, semiconductor nanoparticles containing In and N, semiconductor nanoparticles containing In and P, and semiconductor nanoparticles containing Cd and Se are preferably used. This is because semiconductor nanoparticles having a specific diameter which emit light in the visible range (380 to 780 nm) are readily prepared from semiconductor nanoparticle cores containing In and N or semiconductor nanoparticle cores containing Cd and Se.

Among the above-described semiconductor nanoparticles, InN, InP, and CdSe are more preferably used. This is because InN, InP, and CdSe are readily prepared since the number of materials constituting them is small. In addition, InN, InP, and CdSe have high luminous efficiency upon being irradiated with light emitted from an LED because they exhibit high quantum yield. The term "quantum yield" used herein refers to the ratio of the number of photons emitted by semiconductor nanoparticles as fluorescent light to the number of photons absorbed by the semiconductor nanoparticles. In particular, InN and InP are preferably used since they do not contain Cd, which is a highly toxic element.

The semiconductor nanoparticle may include unintended impurities. At least one element selected from Group-2 elements (Be, Mg, Ca, Sr, and Ba), Zn, and Si may be intentionally added, as a dopant, to the semiconductor nanoparticle at a low concentration. The concentration of the dopant is preferably $1 \times 10^{16}$ to $1 \times 10^{21}$ $cm^{-3}$. It is preferable to use Mg, Zn, or Si as a dopant.

First Organic Compound

The semiconductor phosphor nanoparticle according to the embodiment includes a first organic compound. An end of the first organic compound is bonded to a surface of the semiconductor nanoparticle, and the other end of the first organic compound is polymerized to form a first inorganic layer. In other words, in the semiconductor phosphor nanoparticle, the semiconductor nanoparticle is coated with the first inorganic layer with the main chains of the first organic compounds interposed between the semiconductor nanoparticle and the first inorganic layer. This suppresses occurrence of a mismatch in the lattice constants between the semiconductor nanoparticle and a coating layer at the interface therebetween in the semiconductor phosphor nanoparticle, which occurs when the coating layer is formed directly on the surface of the semiconductor nanoparticle. This allows the semiconductor phosphor nanoparticle to maintain high luminous efficiency.

The first organic compound may include a hydrocarbon chain. In particular, the main chain of the first organic compound preferably includes a hydrocarbon chain having a carbon number of 3 or more. The expression "a main chain includes a hydrocarbon chain having a carbon number of 3 or more" used herein means that the main chain includes a hydrocarbon chain represented by the following Formula (1).

$$-(CH_2)_n- \qquad (1)$$

(where n is an integer of 3 or more)

When n of the hydrocarbon chain represented by Formula (1) is 3 or more, a sufficient distance is maintained between the semiconductor nanoparticle and the first inorganic layer. This allows the first inorganic layer to be formed while the surface of the semiconductor nanoparticle is protected by the first organic compound even when a mismatch in the lattice constants between the semiconductor nanoparticle and the first inorganic layer is large, which allows the semiconductor phosphor nanoparticle to have high luminous efficiency. On the other hand, if n of the hydrocarbon chain is less than 3, an insufficient distance between the semiconductor nanoparticle and the first inorganic layer leads to peeling of the outer end of the first organic compound from the surface of the semiconductor nanoparticle which occurs during formation of the first inorganic layer, which may reduce the luminous efficiency of the semiconductor phosphor nanoparticle. More preferably, n of the hydrocarbon chain is 5 or more.

The end of the first organic compound which is bonded to the surface of the semiconductor nanoparticle may be an amino group, a thiol group, or a phosphoryl group. In such a case, the surface of the semiconductor nanoparticle may be readily protected.

The other end of the first organic compound is polymerized to form a first inorganic layer. In order to form the first inorganic layer, a silicon alkoxide or a metal alkoxide having an amino group, a thiol group, or a phosphoryl group at an end thereof may be used as a first organic compound.

First Inorganic Layer

The first inorganic layer is composed of a substance that does not allow oxygen and moisture to permeate therethrough or a substance having very low permeability to oxygen and moisture. Blocking permeation of oxygen and moisture through the first inorganic layer suppresses degradation of the semiconductor nanoparticle, which results in improvement of the chemical stability of the semiconductor phosphor nanoparticle. The semiconductor nanoparticle can be solidified by being coated with the first inorganic layer, which facilitates the handling of semiconductor phosphor nanoparticles.

The first inorganic layer may be composed of a substance that does not absorb light having a wavelength shorter than the luminous wavelength of the semiconductor nanoparticle. If the first inorganic layer absorbs light having a wavelength longer than the luminous wavelength of the semiconductor nanoparticle, the first inorganic layer absorbs both the excitation light and luminous wavelength of the semiconductor nanoparticle, which results in a reduction in the quantum efficiency of the semiconductor phosphor nanoparticle.

The first inorganic layer may be composed of a silicon oxide or a metal oxide such as $TiO_2$ or $Al_2O_3$, which has high chemical stability.

Method for Producing Semiconductor Phosphor Nanoparticle

Semiconductor nanoparticles and a first organic compound are prepared. The first organic compound is a silicon alkoxide or a metal alkoxide having an amino group, a thiol group, or a phosphoryl group at an end thereof.

An end of the first organic compound which is an amino group, a thiol group, or a phosphoryl group is bonded to the surfaces of the nanoparticles.

The other end of the first organic compound, which is on a side opposite to the side on which the first organic compound is bonded to the surfaces of the semiconductor nanoparticles, is polymerized by hydrolysis to form a first inorganic layer. Thus, semiconductor phosphor nanoparticles are produced.

Embodiment 2

A semiconductor phosphor nanoparticle according to another embodiment of the present disclosure is described with reference to FIG. 2.

Figure 2:
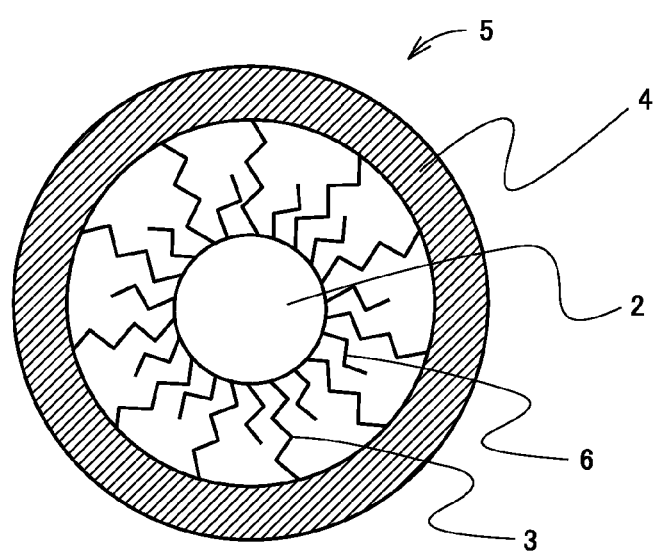
FIG. 2 is a schematic cross-sectional view of a semiconductor phosphor nanoparticle according to another embodiment of the present disclosure.

In FIG. 2, a semiconductor phosphor nanoparticle 5 includes a semiconductor nanoparticle 2, a plural number of first organic compounds 3, and second organic compounds 6 having a shorter main chain than the first organic compounds 3. An end of each first organic compound 3 is bonded to the surface of the semiconductor nanoparticle 2. The other ends are polymerized together to form a first inorganic layer 4.

In the semiconductor phosphor nanoparticle according to the embodiment, the semiconductor nanoparticle is coated with the first inorganic layer with the main chains of the first organic compounds interposed between the semiconductor nanoparticle and the first inorganic layer. This suppresses occurrence of a mismatch in the lattice constants between the semiconductor nanoparticle and a coating layer at the interface therebetween in the semiconductor phosphor nanoparticle, which occurs when the coating layer is formed directly on the surface of the semiconductor nanoparticle. This allows the semiconductor phosphor nanoparticle to maintain high luminous efficiency. Furthermore, the second organic compound having a shorter main chain than the first organic compound is also bonded to the surface of the semiconductor nanoparticle and thereby protects the surface of the semiconductor nanoparticle. This further enhances the luminous efficiency of the semiconductor phosphor nanoparticle.

The semiconductor nanoparticle, the first organic compound, and the first inorganic layer may be the same as in Embodiment 1.

Second Organic Compound

The main chain of the second organic compound is a hydrocarbon chain shorter than the main chain of the first organic compound. Specifically, the main chain of the first organic compound may be a hydrocarbon chain represented by Formula (1) below, and the main chain of the second organic compound may be a hydrocarbon chain represented by Formula (2) below.

(where n is an integer of 3 or more)

(where m is an integer of 1 or more and less than n)

When the first organic compound is, for example, an organic compound having a main chain including a hydrocarbon chain having a carbon number of 3 or more, a region of the surface of the semiconductor nanoparticle may fail to be protected by the first organic compound due to steric hindrance caused by the first organic compound. Thus, the second organic compound that has a shorter main chain than the first organic compound is used together with the first organic compound in order to protect the region of the surface of the semiconductor nanoparticle which is not protected by the first organic compound. This enhances the luminous efficiency of the semiconductor phosphor nanoparticle.

The second organic compound may have an amino group, a thiol group, or a phosphoryl group at an end thereof from the viewpoint of ease of protecting the surface of the semiconductor nanoparticle.

Method for Producing Semiconductor Phosphor Nanoparticle

Semiconductor nanoparticles, a first organic compound, and a second organic compound are prepared. The first organic compound is a silicon alkoxide or a metal alkoxide having an amino group, a thiol group, or a phosphoryl group at an end thereof.

An end of the first organic compound and an end of the second organic compound which are amino groups, thiol groups, or phosphoryl groups are bonded to the surfaces of the nanoparticles.

The other end of the first organic compound, which is on a side opposite to the side on which the first organic compound is bonded to the surfaces of the semiconductor nanoparticles, is polymerized by hydrolysis to form a first inorganic layer. Thus, semiconductor phosphor nanoparticles are prepared.

Embodiment 3

A semiconductor phosphor nanoparticle according to another embodiment of the present disclosure is described below with reference to FIG. 3.

Figure 3:
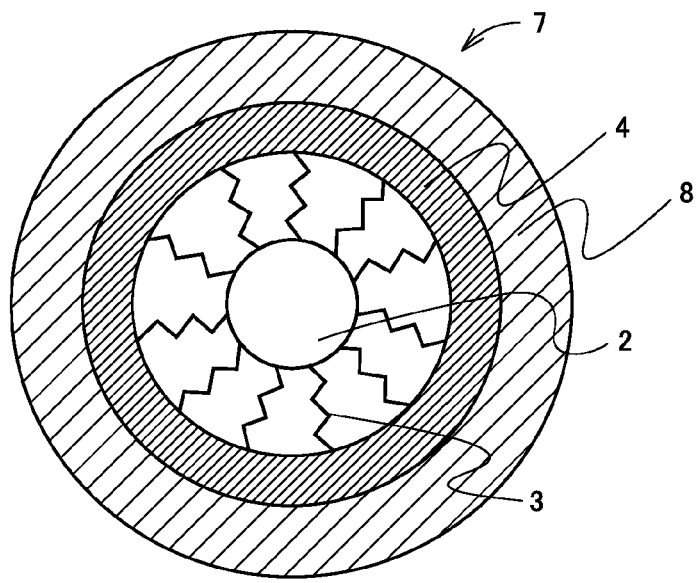
FIG. 3 is a schematic cross-sectional view of a semiconductor phosphor nanoparticle according to another embodiment of the present disclosure.

In FIG. 3, a semiconductor phosphor nanoparticle 7 includes a semiconductor nanoparticle 2 and a plural number of first organic compounds 3. An end of each first organic compound 3 is bonded to the surface of the semiconductor nanoparticle 2. The other ends are polymerized together to form a first inorganic layer 4. A second inorganic layer 8 is formed on the first inorganic layer 4.

In the semiconductor phosphor nanoparticle according to the embodiment, the semiconductor nanoparticle is coated with the first inorganic layer with the main chains of the first organic compounds interposed between the semiconductor nanoparticle and the first inorganic layer. This suppresses occurrence of a mismatch in the lattice constants between the semiconductor nanoparticle and a coating layer at the interface therebetween in the semiconductor phosphor nanoparticle, which occurs when the coating layer is formed directly on the surface of the semiconductor nanoparticle. This allows the semiconductor phosphor nanoparticle to maintain high luminous efficiency. In addition, the second inorganic layer 8 formed on the outer surface of the first inorganic layer 4 improves the ability to block permeation of oxygen, moisture, and the like. This suppresses the degradation of the semiconductor nanoparticle, which results in enhancement of the chemical stability of the semiconductor phosphor nanoparticle.

The semiconductor nanoparticle, the first organic compound, and the first inorganic layer may be the same as in Embodiment 1.

Second Inorganic Layer

The second inorganic layer is composed of a substance that does not allow oxygen and moisture to permeate therethrough or a substance having very low permeability to oxygen and moisture. The material of the second inorganic layer may be the same as, or different from, the material of the first inorganic layer.

The second inorganic layer may be composed of a substance that does not absorb light in a wavelength between the excitation wavelength and the luminous wavelength of the semiconductor nanoparticle. If the second inorganic layer absorbs the light in a wavelength between the excitation wavelength and the luminous wavelength of the semiconductor nanoparticle, the second inorganic layer absorbs both the excitation light and the luminous wavelength of the semiconductor nanoparticle, which results in a reduction in the quantum efficiency of the semiconductor phosphor nanoparticle.

Since the first inorganic layer is formed by polymerizing ends of the first organic compounds, the maximum thickness of the first inorganic layer is limited. However, in this embodiment, the second inorganic layer is formed on the outer surface of the first inorganic layer and the thickness of the second inorganic layer may be controlled to a desired thickness. This enhances an effect of blocking oxygen and moisture produced by the inorganic layers, which suppresses degradation of the semiconductor nanoparticle. As a result, the chemical stability of the semiconductor phosphor nanoparticle may be enhanced.

The second inorganic layer may be composed of a silicon oxide or a metal oxide such as $TiO_2$ or $Al_2O_3$, which has high chemical stability.

Method for Producing Semiconductor Phosphor Nanoparticle

Semiconductor nanoparticles and a first organic compound are prepared. The first organic compound is a silicon alkoxide or a metal alkoxide having an amino group, a thiol group, or a phosphoryl group at an end thereof.

An end of the first organic compound which is an amino group, a thiol group, or a phosphoryl group is bonded to the surfaces of the nanoparticles.

The other end of the first organic compound, which is on a side opposite to the side on which the first organic compound is bonded to the surfaces of the semiconductor nanoparticles, is polymerized by hydrolysis to form a first inorganic layer.

Subsequently, a second inorganic layer is formed on the outer surface of the first inorganic layer by a sol-gel process or the like using a metal alkoxide. Thus, semiconductor phosphor nanoparticles are prepared. In particular, in the case where the metal alkoxide is a silicon alkoxide, a transparent glass layer containing silicon is formed as the second inorganic layer.

Embodiment 4

A semiconductor phosphor nanoparticle according to another embodiment of the present disclosure is described below with reference to FIGS. 4 and 5.

Figure 4:
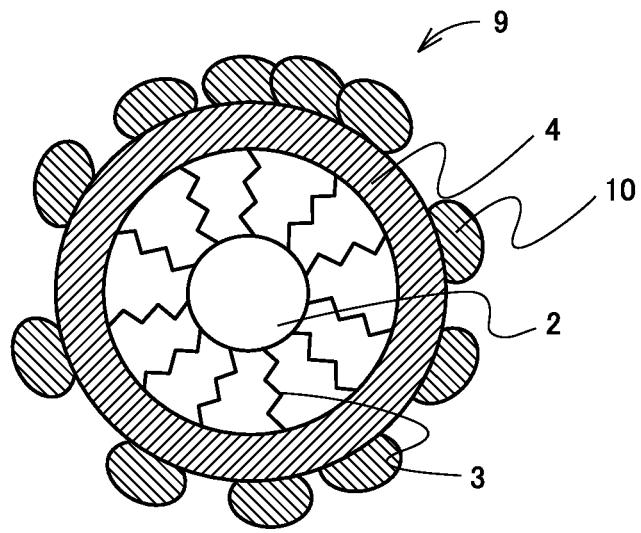
FIG. 4 is a schematic cross-sectional view of a semiconductor phosphor nanoparticle according to another embodiment of the present disclosure.
Figure 5:
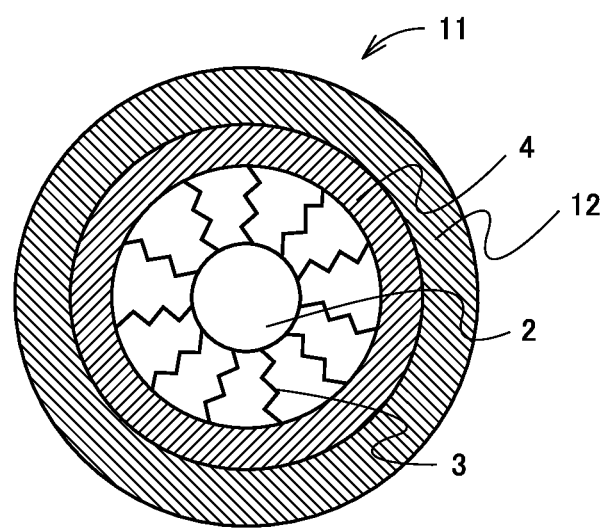
FIG. 5 is a schematic cross-sectional view of a semiconductor phosphor nanoparticle according to another embodiment of the present disclosure.

In FIG. 4, a semiconductor phosphor nanoparticle 9 includes a semiconductor nanoparticle 2 and a plural number of first organic compounds 3. An end of each first organic compound 3 is bonded to the surface of the semiconductor nanoparticle 2. The other ends are polymerized together to form a first inorganic layer 4. Inorganic crystals 10 are formed on the outer surface of the first inorganic layer 4. In FIG. 4, the inorganic crystals 10 are formed partially on the outer surface of the first inorganic layer 4. Alternatively, as shown in FIG. 5, inorganic crystals 12 may be formed so as to cover the entire outer surface of the first inorganic layer 4.

In the semiconductor phosphor nanoparticle according to the embodiment, the semiconductor nanoparticle is coated with the first inorganic layer with the main chains of the first organic compounds interposed between the semiconductor nanoparticle and the first inorganic layer. This suppresses occurrence of a mismatch in the lattice constants between the semiconductor nanoparticle and a coating layer at the interface therebetween in the semiconductor phosphor nanoparticle, which occurs when the coating layer is formed directly on the surface of the semiconductor nanoparticle. This allows the semiconductor phosphor nanoparticle to maintain high luminous efficiency. In addition, the inorganic crystals formed on the outer surface of the first inorganic layer enhance the chemical stability of the semiconductor phosphor nanoparticle.

The semiconductor nanoparticle, the first organic compound, and the first inorganic layer may be the same as in Embodiment 1.

Inorganic Crystal

The inorganic crystal is composed of a substance that absorbs ultraviolet radiation. Use of an inorganic crystal that absorbs ultraviolet radiation suppresses degradations of the semiconductor nanoparticle and the organic compounds which are caused due to ultraviolet radiation, which enhances the chemical stability of the semiconductor phosphor nanoparticle.

Examples of the inorganic crystal include wide-gap semiconductor nanoparticles such as ZnS, ZnO, $TiO_2$, $ZrO_2$, ZnO:Mg, ZnO:Be, and GaN; and inorganic phosphor nanoparticles such as $YVO_4$.

Method for Producing Semiconductor Phosphor Nanoparticle

Semiconductor nanoparticles and a first organic compound are prepared. The first organic compound is a silicon alkoxide or a metal alkoxide having an amino group, a thiol group, or a phosphoryl group at an end thereof.

An end of the first organic compound which is an amino group, a thiol group, or a phosphoryl group is bonded to the surfaces of the nanoparticles.

The other end of the first organic compound, which is on a side opposite to the side on which the first organic compound is bonded to the surfaces of the semiconductor nanoparticles, is polymerized by hydrolysis to form a first inorganic layer.

Subsequently, inorganic crystals are formed on the outer surface of the first inorganic layer by a sol-gel process, a liquid-phase reduction method, hydrothermal synthesis, or the like. Thus, phosphor nanoparticles are produced.

Embodiment 5

A light-emitting device according to another embodiment of the present disclosure is described below with reference to FIG. 6.

Figure 6:
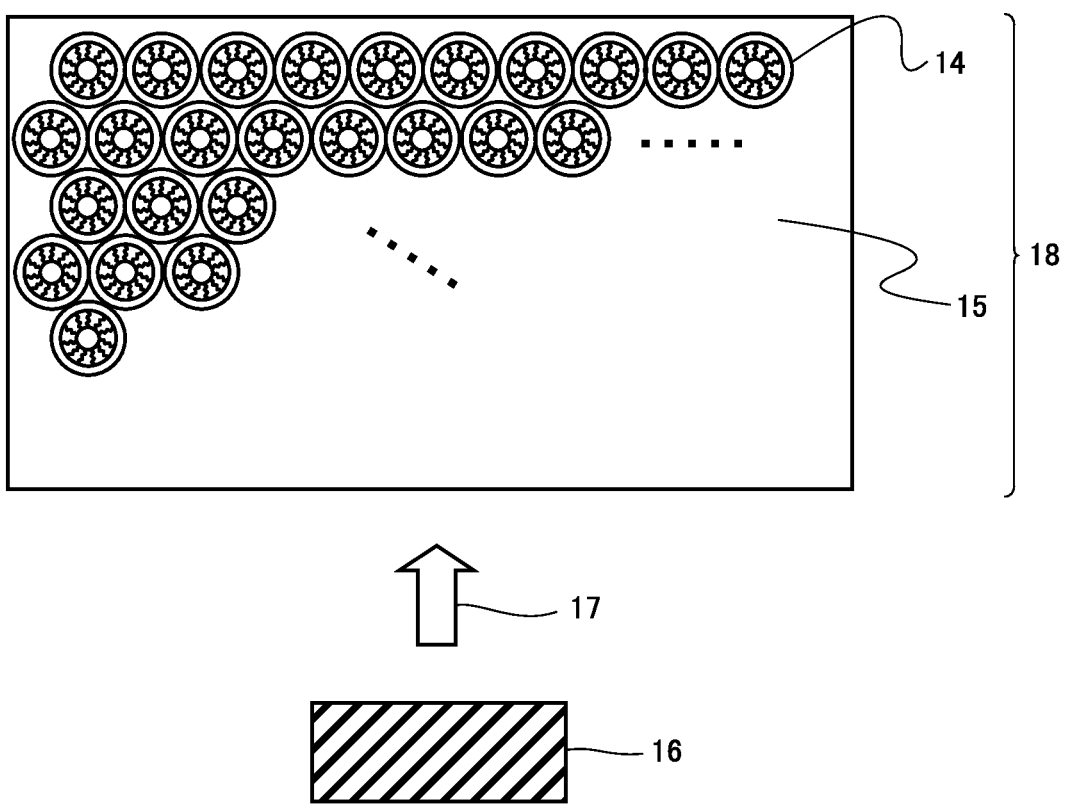
FIG. 6 is a schematic cross-sectional view of a light-emitting device according to another embodiment of the present disclosure.

In FIG. 6, a light-emitting device 13 is a light-emitting apparatus that emits, for example, white light, which is suitably used as a lighting apparatus. The light-emitting device 13 includes a light source 16 that emits primary light 17 and a wavelength conversion unit 18 that includes a transparent member 15. The transparent member 15 contains semiconductor phosphor nanoparticles 14 that emit secondary light upon absorbing at least part of the primary light 17.

Light Source

The light source (excitation light source) emits primary light that is to be absorbed by the semiconductor phosphor nanoparticles. The primary light has a peak luminous wavelength that at least partially overlaps the absorption wavelength of the semiconductor phosphor nanoparticle. As a light source that emits the primary light, generally, a light source having a luminous wavelength range that covers from the ultraviolet region to the blue region is used. Examples of such a light source include a light-emitting diode (LED) and a laser diode (LD). An organic electroluminescence light-emitting device and an inorganic electroluminescence light-emitting device may also be used. Among LEDs and LDs, for example, a GaN-based LED and a GaN-based LD are preferably used. The light source may be used alone or in combination of two or more.

Transparent Member

The transparent member is a member in which the semiconductor phosphor nanoparticles are contained and dispersed. In other words, the transparent member is a member in which the semiconductor phosphor nanoparticles are encapsulated. At least a portion of the outer surface of the transparent member serves as a light incidence plane through which the primary light emitted by the light source enters. At least part of the primary light entered through the light incidence plane is absorbed by the semiconductor phosphor nanoparticles, and thereby the semiconductor phosphor nanoparticles emit light.

The transparent member, which may occupy a large portion of the wavelength conversion unit, has light transparency and may be transparent. This allows the light-emitting apparatus to have light transparency while the light-emitting apparatus is not used, which makes the light-emitting apparatus inconspicuous. The term "transparent" used herein refers to having a visible light transmittance of 90% or more. Examples of a material for the transparent member include, but are not particularly limited to, translucent (transparent) resins such as an acrylic resin and a silicone resin; and a glass material. In particular, an acrylic resin such as poly(lauryl methacrylate) is preferably used because of high dispersibility of the semiconductor phosphor nanoparticles in an acrylic resin.

Although a single type of semiconductor phosphor nanoparticles are used in the light-emitting device shown in FIG. 6, the embodiment is not limited to this. For example, two or more types of semiconductor phosphor nanoparticles may be used. The types and combinations of the semiconductor phosphor nanoparticles may be controlled appropriately depending on a desired hue of the secondary light that is to be emitted from the wavelength conversion unit.

Wavelength Conversion Unit

The wavelength conversion unit includes the transparent member and the semiconductor phosphor nanoparticles dispersed in the transparent member. The content of the semiconductor phosphor nanoparticles in the wavelength conversion unit is 0.001% by weight or more and 10% by weight or less and is preferably 0.1% by weight or more and 5% by weight or less relative to 100% by weight of the total weight of the transparent member and the semiconductor phosphor nanoparticles. When the content of the semiconductor phosphor nanoparticles is 0.001% by weight or more and 10% by weight or less, the wavelength conversion unit contains the phosphor nanoparticles at a high concentration, which enhances the luminous efficiency of the light-emitting device.

EXAMPLES

The present disclosure is described more in detail with reference to examples below. However, the present disclosure is not limited to these examples.

Example 1

Production Example 1

Preparation of Semiconductor Phosphor Nanoparticles

Hexadecanethiol (0.5 mmol), $NaNH_2$ (1.5 mmol), and octadecene (10 ml) were added to indium myristate (0.5 mmol), and the resulting mixture was heated at about 180° C. for 1 hour. Thus, an InN colloidal solution in which the surfaces of the dispersed particles were protected by hexadecanethiol was prepared. Subsequently, 3-mercaptopropyltrimethoxysilane (0.5 mmol) was added to the InN colloidal solution, and the resulting mixture was heated at about 80° C. for 1 hour. Thus, an InN colloidal solution in which the surfaces of the dispersed particles were protected by 3-mercaptopropyltrimethoxysilane was prepared. Then, hydrolysis was performed to prepare a solution in which InN semiconductor nanoparticles each coated with a $SiO_2$ layer were dispersed. The InN semiconductor nanoparticles each included an organic compound interposed between the $SiO_2$ layer and InN.

Preparation of Light-Emitting Device

The semiconductor phosphor nanoparticles and the transparent member shown in Table 1 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared. A light-emitting device shown in FIG. 6 was prepared using the wavelength conversion unit. The light source used was a blue-light-emitting device having an emission wavelength of 405 nm.

Performance Evaluation

The luminescence intensity of fluorescent light (wavelength: 600 nm) emitted upon the wavelength conversion unit absorbing excitation light of 405 nm was measured. A change in the luminescence intensity over time (minute) was calculated on a percentage basis with 100% being the luminescence intensity measured at the beginning of the measurement, and the percentage was considered to be luminous efficiency. Table 1 shows the results.

TABLE 1

| | | Production Example 1 | Production Example 2 | Production Example 3 | Production Example 4 | Production Example 5 | Production Example 6 |
|---|---|---|---|---|---|---|---|
| Components of semiconductor phosphor nanoparticle | Semiconductor nanoparticle | InN | InP | CdSe | InN | InN | InN |
| | First organic compound | 3-Mercaptopropyltrimethoxysilane [*1] | 3-Mercaptopropyltrimethoxysilane [*1] | 3-Mercaptopropyltrimethoxysilane [*1] | 3-Aminopropyldimethylchlorosilane [*2] | 3-Aminopropyltriethoxytitanium [*3] | 3-Mercaptopropyltrimethoxytitanium [*4] |

TABLE 1-continued

|  | | Production Example 1 | Production Example 2 | Production Example 3 | Production Example 4 | Production Example 5 | Production Example 6 |
|---|---|---|---|---|---|---|---|
|  | First inorganic layer | $SiO_2$ | $SiO_2$ | $SiO_2$ | $SiO_2$ | $TiO_2$ | $TiO_2$ |
| Transparent material | | Glass | Glass | Glass | PMMA[*5] | Glass | Glass |
| Performance evaluation | After 30 minutes (%) | 80 | 80 | 80 | 80 | 90 | 90 |
|  | After 60 minutes (%) | 70 | 70 | 70 | 70 | 80 | 80 |

[*1] 3-mercaptopropyltrimethoxysilane: $(CH_3O)_3SiC_3H_6SH$
[*2] 3-aminopropyldimethylchlorosilane: $Cl(CH_3)_2SiC_3H_6NH_2$
[*3] 3-aminopropyltriethoxytitanium: $(CH_3O)_3TiC_3H_6NH_2$
[*4] 3-mercaptopropyltrimethoxytitanium: $(CH_3O)_3TiC_3H_6SH$
[*5] PMMA: polymethyl methacrylate resin Evaluation Results The luminescence intensity of the light-emitting device that included the wavelength conversion unit prepared in Production Example 1 was 80% after a lapse of 30 minutes and 70% after a lapse of 60 minutes.

Production Example 2

The same production method was employed as in Production Example 1 except that trimethylsilylphosphine $((TMS)_3P)$ was used instead of $NaNH_2$ to prepare a solution in which InP semiconductor nanoparticles each coated with a $SiO_2$ layer were dispersed. The InP semiconductor nanoparticles each included an organic compound interposed between the $SiO_2$ layer and InP.

Production Example 3

The same production method was employed as in Production Example 1 except that cadmium stearate and selenium dissolved in TOP were used instead of indium myristate and $NaNH_2$, respectively, to prepare a solution in which CdSe semiconductor nanoparticles each coated with a $SiO_2$ layer were dispersed. The CdSe semiconductor nanoparticles each included an organic compound interposed between the $SiO_2$ layer and CdSe.

Production Example 4

The same production method was employed as in Production Example 1 except that 3-aminopropyldimethylchlorosilane was used as the first organic compound to prepare a solution in which InN semiconductor nanoparticles each coated with a $SiO_2$ layer were dispersed. The InN semiconductor nanoparticles each included an organic compound interposed between the $SiO_2$ layer and InN.

Production Example 5

The same production method was employed as in Production Example 1 except that 3-aminopropyltriethoxytitanium was used as the first organic compound to produce a solution in which InN semiconductor nanoparticles each coated with a $TiO_2$ layer were dispersed. The InN semiconductor nanoparticles each included an organic compound interposed between the $TiO_2$ layer and InN.

Production Example 6

The same production method was employed as in Production Example 1 except that 3-mercaptopropyltrimethoxytitanium was used as the first organic compound to prepare a solution in which InN semiconductor nanoparticles each coated with a $TiO_2$ layer were dispersed. The InN semiconductor nanoparticles each included an organic compound interposed between the $TiO_2$ layer and InN.

Preparation of Light-Emitting Device

In Production Examples 2 to 6, the semiconductor phosphor nanoparticles and the transparent member shown in Table 1 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared.

A light-emitting device shown in FIG. 6 was prepared using each wavelength conversion unit. The light source used was a blue-light-emitting device having an emission wavelength of 405 nm.

Performance Evaluation

A change in the luminescence intensity of each light-emitting device was measured as in Production Example 1. A change in the luminescence intensity over time (minute) was calculated on a percentage basis with 100% being the luminescence intensity measured at the beginning of the measurement, and the percentage was considered to be luminous efficiency. Table 1 shows the results.

Evaluation Results

The luminescence intensity of the light-emitting device that included the wavelength conversion unit prepared in Production Example 2 was 80% after a lapse of 30 minutes and 70% after a lapse of 60 minutes.

The luminescence intensity of the light-emitting device that included the wavelength conversion unit prepared in Production Example 3 was 80% after a lapse of 30 minutes and 70% after a lapse of 60 minutes.

The luminescence intensity of the light-emitting device that included the wavelength conversion unit prepared in Production Example 4 was 80% after a lapse of 30 minutes and 70% after a lapse of 60 minutes.

The luminescence intensity of the light-emitting device that included the wavelength conversion unit prepared in Production Example 5 was 90% after a lapse of 30 minutes and 80% after a lapse of 60 minutes.

The luminescence intensity of the light-emitting device that included the wavelength conversion unit prepared in Production Example 6 was 90% after a lapse of 30 minutes and 80% after a lapse of 60 minutes.

In Production Examples 5 and 6, the $TiO_2$ layer used as the first inorganic layer of each semiconductor phosphor nanoparticle reduced the amount of ultraviolet radiation that reached the semiconductor nanoparticle more than a $SiO_2$ layer, which suppressed degradation of the performance of the semiconductor nanoparticle.

Example 2

Production Example 7

Preparation of Semiconductor Phosphor Nanoparticles

Hexadecanethiol (0.5 mmol), NaNH$_2$ (1.5 mmol), and octadecene (10 ml) were added to indium myristate (0.5 mmol), and the resulting mixture was heated at about 180° C. for 1 hour. Thus, an InN colloidal solution in which the surfaces of the dispersed particles were protected by hexadecanethiol was prepared. Subsequently, 3-mercaptopropyltrimethoxysilane (0.5 mmol) and methylamine (0.5 mmol) were added to the InN colloidal solution, and the resulting mixture was heated at about 80° C. for 1 hour. Thus, an InN colloidal solution in which the surfaces of the dispersed particles were protected by 3-mercaptopropyltrimethoxysilane and methylamine was prepared. Then, hydrolysis was performed to prepare a solution in which InN semiconductor nanoparticles each coated with a SiO$_2$ layer were dispersed. The InN semiconductor nanoparticles each included an organic compound interposed between the SiO$_2$ layer and InN.

Preparation of Light-Emitting Device

The semiconductor phosphor nanoparticles and the transparent member shown in Table 2 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared. A light-emitting device shown in FIG. 6 was prepared using the wavelength conversion unit. The light source used was a blue-light-emitting device having an emission wavelength of 405 nm.

Performance Evaluation

The luminescence intensity of fluorescent light (wavelength: 600 nm) emitted upon the wavelength conversion unit absorbing excitation light having a wavelength of 405 nm was measured. A change in the luminescence intensity over time (minute) was calculated on a percentage basis with 100% being the luminescence intensity measured at the beginning of the measurement, and the percentage was considered to be luminous efficiency. Table 2 shows the results.

Evaluation Results

The luminescence intensity of the light-emitting device that included the wavelength conversion unit prepared in Production Example 7 was 80% after a lapse of 30 minutes and 70% after a lapse of 60 minutes. In the production method employed in Production Example 7, the InN semiconductor nanoparticles were protected by two types of organic compounds, that is, 3-mercaptopropyltrimethoxysilane and methylamine, and thereby a wavelength conversion unit having high luminescence intensity at the beginning of the measurement was prepared.

Production Example 8

The same production method was employed as in Production Example 7 except that 3-mercaptopropyltrimethoxytitanium was used as the first organic compound to prepare a solution in which InN semiconductor nanoparticles each coated with a TiO$_2$ layer were dispersed. The InN semiconductor nanoparticles each included an organic compound interposed between the TiO$_2$ layer and InN.

Production Example 9

The same production method was employed as in Production Example 7 except that trimethylsilylphosphine ((TMS)$_3$P) was used instead of NaNH$_2$ and 3-aminopropyldimethylchlorosilane was used as the first organic compound to prepare a solution in which InN semiconductor nanoparticles each coated with a SiO$_2$ layer were dispersed. The InN semiconductor nanoparticles each included an organic compound interposed between the SiO$_2$ layer and InN.

Production Example 10

The same production method was employed as in Production Example 7 except that 3-aminopropyldimethylchlorosilane was used as the first organic compound and methanethiol was used as the second organic compound to prepare a solution in which InN semiconductor nanoparticles each coated with a SiO$_2$ layer were dispersed. The InN semiconductor nanoparticles each included an organic compound interposed between the SiO$_2$ layer and InN.

TABLE 2

| | | Production Example 7 | Production Example 8 | Production Example 9 | Production Example 10 |
|---|---|---|---|---|---|
| Components of semiconductor phosphor nanoparticle | Semiconductor nanoparticle | InN | InN | InP | InP |
| | First organic compound | 3-Mercaptopropyl-trimethoxysilane[*1] | 3-Mercaptopropyl-trimethoxytitanium[*4] | 3-Aminopropyl-dimethylchlorosilane[*2] | 3-Aminopropyl-dimethylchlorosilane[*2] |
| | Second organic compound | Methylamine | Methylamine | Methylamine | Methanethiol |
| | First inorganic layer | SiO$_2$ | TiO$_2$ | SiO$_2$ | SiO$_2$ |
| Transparent material | | Glass | Glass | PMMA[*5] | PMMA[*5] |
| Performance evaluation | After 30 minutes (%) | 80 | 90 | 80 | 80 |
| | After 60 minutes (%) | 70 | 80 | 70 | 70 |

[*1] 3-mercaptopropyltrimethoxysilane: (CH$_3$O)$_3$SiC$_3$H$_6$SH
[*2] 3-aminopropyldimethylchlorosilane: Cl(CH$_3$)$_2$SiC$_3$H$_6$NH$_2$
[*4] 3-mercaptopropyltrimethoxytitanium: (CH$_3$O)$_3$TiC$_3$H$_6$SH
[*5] PMMA: polymethyl methacrylate resin Preparation of Light-Emitting Device In Production Examples 8 to 10, the semiconductor phosphor nanoparticles and the transparent member shown in Table 2 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared.

A light-emitting device shown in FIG. 6 was prepared using each wavelength conversion unit. The light source used was a blue-light-emitting device having an emission wavelength of 405 nm.

Performance Evaluation

A change in the luminescence intensity of each light-emitting device was measured as in Production Example 7. A change in the luminescence intensity over time (minute) was calculated on a percentage basis with 100% being the luminescence intensity measured at the beginning of the measurement, and the percentage was considered to be luminous efficiency. Table 2 shows the results.

Evaluation Results

The luminescence intensity of the light-emitting device that included the wavelength conversion unit prepared in Production Example 8 was 90% after a lapse of 30 minutes and 80% after a lapse of 60 minutes. In Production Example 8, the $TiO_2$ layer used as the first inorganic layer of the semiconductor phosphor nanoparticle reduced the amount of ultraviolet radiation that reached the semiconductor nanoparticle more than a $SiO_2$ layer, which suppressed degradation of the performance of the semiconductor nanoparticle.

The luminescence intensity of the light-emitting device that included the wavelength conversion unit prepared in Production Example 9 was 80% after a lapse of 30 minutes and 70% after a lapse of 60 minutes.

The luminescence intensity of the light-emitting device that included the wavelength conversion unit prepared in Production Example 10 was 80% after a lapse of 30 minutes and 70% after a lapse of 60 minutes.

mmol), and the resulting mixture was heated at about 180° C. for 1 hour. Thus, an InN colloidal solution in which the surfaces of the dispersed particles were protected by hexadecanethiol was prepared. Subsequently, 3-mercaptopropyltrimethoxysilane (0.5 mmol) was added to the InN colloidal solution, and the resulting mixture was heated at about 80° C. for 1 hour. Thus, an InN colloidal solution in which the surfaces of the dispersed particles were protected by 3-mercaptopropyltrimethoxysilane was prepared. Then, hydrolysis was performed to prepare a solution in which InN semiconductor nanoparticles each coated with a $SiO_2$ layer were dispersed. The InN semiconductor nanoparticles each included an organic compound interposed between the $SiO_2$ layer and InN. Subsequently, tetraethoxysilane (0.5 mmol) was added to the dispersion, and hydrolysis was performed to prepare a solution in which InN semiconductor nanoparticles that included a thickened $SiO_2$ layer were dispersed.

Preparation of Light-Emitting Device

The semiconductor phosphor nanoparticles and the transparent member shown in Table 3 were mixed so that the content of the semiconductor phosphor nanoparticles was 0.04% by weight relative to 100% by weight of the total weight of the transparent member and the semiconductor phosphor nanoparticles dispersed in the transparent member. Thus, a wavelength conversion unit was prepared. A light-emitting device shown in FIG. 6 was prepared using the wavelength conversion unit. The light source used was a blue-light-emitting device having an emission wavelength of 405 nm.

Performance Evaluation

The luminescence intensity of fluorescent light (wavelength: 600 nm) emitted upon the wavelength conversion unit absorbing excitation light having a wavelength of 405 nm was measured. A change in the luminescence intensity over time (minute) was calculated on a percentage basis with 100% being the luminescence intensity measured at the beginning of the measurement, and the percentage was considered to be luminous efficiency. Table 3 shows the results.

TABLE 3

|  |  | Production Example 11 | Production Example 12 | Production Example 13 | Production Example 14 |
|---|---|---|---|---|---|
| Components of semiconductor phosphor nanoparticle | Semiconductor nanoparticle | InN | InN | InP | InP |
|  | First organic compound | 3-Mercaptopropyl-trimethoxysilane[*1] | 3-Mercaptopropyl-trimethoxysilane[*1] | 3-Mercaptopropyl-trimethoxysilane[*1] | 3-Mercaptopropyl-trimethoxysilane[*1] |
|  | First inorganic layer | $SiO_2$ | $SiO_2$ | $SiO_2$ | $SiO_2$ |
|  | Second inorganic layer | $SiO_2$ | $TiO_2$ | $Al_2O_3$ | $ZnO$ |
| Transparent material |  | Glass | Glass | Glass | Glass |
| Performance evaluation | After 30 minutes (%) | 85 | 90 | 85 | 90 |
|  | After 60 minutes (%) | 75 | 80 | 75 | 80 |

[*1]3-mercaptopropyltrimethoxysilane: $(CH_3O)_3SiC_3H_6SH$

Example 3

Production Example 11

Preparation of Semiconductor Phosphor Nanoparticles

Hexadecanethiol (0.5 mmol), $NaNH_2$ (1.5 mmol), and octadecene (10 ml) were added to indium myristate (0.5

Evaluation Results

The luminescence intensity of the light-emitting device that included the wavelength conversion unit prepared in Production Example 11 was 85% after a lapse of 30 minutes and 75% after a lapse of 60 minutes. In Production Example 11, since the semiconductor phosphor nanoparticle included the first inorganic layer and the second inorganic layer, the total thickness of the $SiO_2$ layers was large, which enhanced gas barrier property. This suppressed degradation of the performance of the semiconductor nanoparticle.

Production Example 12

The same production method was employed as in Production Example 11 except that a $TiO_2$ layer was used as the second inorganic layer to prepare a solution in which InN semiconductor nanoparticles each coated with a $SiO_2$ layer and a $TiO_2$ layer formed on the outer surface of the $SiO_2$ layer were dispersed. The InN semiconductor nanoparticles each included an organic compound interposed between the $SiO_2$ layer and InN.

Production Example 13

The same production method was employed as in Production Example 11 except that trimethylsilylphosphine ($(TMS)_3P$) was used instead of $NaNH_2$ and an $Al_2O_3$ layer was used as the second inorganic layer to prepare a solution in which InP semiconductor nanoparticles each coated with a $SiO_2$ layer and an $Al_2O_3$ layer formed on the outer surface of the $SiO_2$ layer were dispersed. The InP semiconductor nanoparticles each included an organic compound interposed between the $SiO_2$ layer and InP.

Production Example 14

The same production method was employed as in Production Example 11 except that trimethylsilylphosphine ($(TMS)_3P$) was used instead of $NaNH_2$ and a ZnO layer was used as the second inorganic layer to prepare a solution in which InP semiconductor nanoparticles each coated with a $SiO_2$ layer and a ZnO layer formed on the outer surface of the $SiO_2$ layer were dispersed. The InP semiconductor nanoparticles each included an organic compound interposed between the $SiO_2$ layer and InP.

Preparation of Light-Emitting Device

In Production Examples 12 to 14, the semiconductor phosphor nanoparticles and the transparent member shown in Table 3 were mixed so that the content of the semiconductor phosphor nanoparticles was 0.04% by weight relative to 100% by weight of the total weight of the transparent member and the semiconductor phosphor nanoparticles dispersed in the transparent member. Thus, a wavelength conversion unit was prepared.

A light-emitting device shown in FIG. 6 was prepared using each wavelength conversion unit. The light source used was a blue-light-emitting device having an emission wavelength of 405 nm.

Performance Evaluation

A change in the luminescence intensity of each light-emitting device was measured as in Production Example 11. A change in the luminescence intensity over time (minute) was calculated on a percentage basis with 100% being the luminescence intensity measured at the beginning of the measurement, and the percentage was considered to be luminous efficiency. Table 3 shows the results.

Evaluation Results

The luminescence intensity of the light-emitting device that included the wavelength conversion unit prepared in Production Example 12 was 90% after a lapse of 30 minutes and 80% after a lapse of 60 minutes. In Production Example 12, since the semiconductor phosphor nanoparticle included two inorganic layers, the total thickness of the inorganic layers was large, which enhanced gas barrier property and, in addition, the $TiO_2$ layer reduced the amount of ultraviolet radiation that reached the semiconductor nanoparticle more than a $SiO_2$ layer. This suppressed degradation of the performance of the semiconductor nanoparticle.

The luminescence intensity of the light-emitting device that included the wavelength conversion unit prepared in Production Example 13 was 85% after a lapse of 30 minutes and 75% after a lapse of 60 minutes. In Production Example 13, since the semiconductor phosphor nanoparticle included two inorganic layers, the total thickness of the inorganic layers was large, which enhanced gas barrier property and, in addition, the $Al_2O_3$ layer reduced the amount of ultraviolet radiation that reached the semiconductor nanoparticle more than a $SiO_2$ layer. This suppressed degradation of the performance of the semiconductor nanoparticle.

The luminescence intensity of the light-emitting device that included the wavelength conversion unit prepared in Production Example 14 was 90% after a lapse of 30 minutes and 80% after a lapse of 60 minutes. In Production Example 14, since the semiconductor phosphor nanoparticle included two inorganic layers, the total thickness of the inorganic layers was large, which enhanced gas barrier property and, in addition, the ZnO layer reduced the amount of ultraviolet radiation that reached the semiconductor nanoparticle more than a $SiO_2$ layer. This suppressed degradation of the performance of the semiconductor nanoparticle.

Example 4

Production Example 15

Preparation of Semiconductor Phosphor Nanoparticles

Hexadecanethiol (0.5 mmol), $NaNH_2$ (1.5 mmol), and octadecene (10 ml) were added to indium myristate (0.5 mmol), and the resulting mixture was heated at about 180° C. for 1 hour. Thus, an InN colloidal solution in which the surfaces of the dispersed particles were protected by hexadecanethiol was prepared. Subsequently, 3-mercaptopropyltrimethoxysilane (0.5 mmol) was added to the InN colloidal solution, and the resulting mixture was heated at about 80° C. for 1 hour. Thus, an InN colloidal solution in which the surfaces of the dispersed particles were protected by 3-mercaptopropyltrimethoxysilane was prepared. Then, hydrolysis was performed to prepare a solution in which InN semiconductor nanoparticles each coated with a $SiO_2$ layer were dispersed. The InN semiconductor nanoparticles each included an organic compound interposed between the $SiO_2$ layer and InN. Subsequently, titanium tetraisopropoxide (0.5 mmol) was added to the dispersion, and hydrolysis was performed to form $TiO_2$ microcrystals on the $SiO_2$ layer.

Preparation of Light-Emitting Device

The semiconductor phosphor nanoparticles and the transparent member shown in Table 4 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared. A light-emitting device shown in FIG. 6 was prepared using the wavelength conversion unit. The light source used was a blue-light-emitting device having an emission wavelength of 405 nm.

Performance Evaluation

The luminescence intensity of fluorescent light (wavelength: 600 nm) emitted upon the wavelength conversion unit absorbing excitation light having a wavelength of 405 nm was measured. A change in the luminescence intensity over time (minute) was calculated on a percentage basis with 100% being the luminescence intensity measured at the beginning of the measurement, and the percentage was considered to be luminous efficiency. Table 4 shows the results.

TABLE 4

|  |  | Production Example 15 | Production Example 16 | Production Example 17 | Production Example 18 |
|---|---|---|---|---|---|
| Components of semiconductor phosphor nanoparticle | Semiconductor nanoparticle | InN | InN | InN | InN |
|  | First organic compound | 3-Mercaptopropyl-trimethoxysilane[*1] | 3-Mercaptopropyl-trimethoxysilane[*1] | 3-Aminopropyl-triethoxytitanium[*3] | 3-Aminopropyl-triethoxytitanium[*3] |
|  | First inorganic layer | $SiO_2$ | $SiO_2$ | $TiO_2$ | $TiO_2$ |
|  | Inorganic crystal | $TiO_2$ | ZnO | ZnO | $Al_2O_3$ |
| Transparent material |  | Glass | Glass | PMMA[*5] | PMMA[*5] |
| Performance evaluation | After 30 minutes (%) | 87 | 87 | 95 | 90 |
|  | After 60 minutes (%) | 77 | 77 | 85 | 80 |

[*1] 3-mercaptopropyltrimethoxysilane: $(CH_3O)_3SiC_3H_6SH$
[*3] 3-aminopropyltriethoxytitanium: $(CH_3O)_3TiC_3H_6NH_2$
[*5] PMMA: polymethyl methacrylate resin Evaluation Results The luminescence intensity of the light-emitting device that included the wavelength conversion unit prepared in Production Example 15 was 87% after a lapse of 30 minutes and 77% after a lapse of 60 minutes. In Production Example 15, the $TiO_2$ inorganic crystals formed on the first inorganic layer of the semiconductor phosphor nanoparticle reduced the amount of ultraviolet radiation that reached the semiconductor nanoparticle more than in the case where the first inorganic layer was formed alone, which suppressed degradation of the performance of the semiconductor nanoparticle.

Production Example 16

The same production method was employed as in Production Example 15 except that the inorganic crystal was ZnO to prepare a solution in which InN semiconductor nanoparticles each coated with a $SiO_2$ layer including ZnO microcrystals formed on the $SiO_2$ layer were dispersed. The InN semiconductor nanoparticles each included an organic compound interposed between the $SiO_2$ layer and InN.

Production Example 17

The same production method was employed as in Production Example 15 except that 3-aminopropyltriethoxytitanium was used as the first organic compound and the inorganic crystal was ZnO to prepare a solution in which InN semiconductor nanoparticles each coated with a $TiO_2$ layer including ZnO microcrystals formed on the $TiO_2$ layer were dispersed. The InN semiconductor nanoparticles each included an organic compound interposed between the $TiO_2$ layer and InN.

Production Example 18

The same production method was employed as in Production Example 15 except that 3-aminopropyltriethoxytitanium was used as the first organic compound and the inorganic crystal was $Al_2O_3$ to prepare a solution in which InN semiconductor nanoparticles each coated with a $TiO_2$ layer including $Al_2O_3$ microcrystals formed on the $TiO_2$ layer were dispersed. The InN semiconductor nanoparticles each included an organic compound interposed between the $TiO_2$ layer and InN.

Preparation of Light-Emitting Device

In Production Examples 16 to 18, the semiconductor phosphor nanoparticles and the transparent member shown in Table 4 were mixed so that the content of the semiconductor phosphor nanoparticles was 0.03% by weight relative to 100% by weight of the total weight of the transparent member and the semiconductor phosphor nanoparticles dispersed in the transparent member. Thus, a wavelength conversion unit was prepared.

A light-emitting device shown in FIG. 6 was prepared using each wavelength conversion unit. The light source used was a blue-light-emitting device having an emission wavelength of 405 nm.

Performance Evaluation

A change in the luminescence intensity of each light-emitting device was measured as in Production Example 15. A change in the luminescence intensity over time (minute) was calculated on a percentage basis with 100% being the luminescence intensity measured at the beginning of the measurement, and the percentage was considered to be luminous efficiency. Table 4 shows the results.

Evaluation Results

The luminescence intensity of the light-emitting device that included the wavelength conversion unit prepared in Production Example 16 was 87% after a lapse of 30 minutes and 77% after a lapse of 60 minutes.

The luminescence intensity of the light-emitting device that included the wavelength conversion unit prepared in Production Example 17 was 95% after a lapse of 30 minutes and 85% after a lapse of 60 minutes.

In Production Examples 16 and 17, the ZnO inorganic crystals formed on the first inorganic layer of the semiconductor phosphor nanoparticle reduced the amount of ultraviolet radiation that reached the semiconductor nanoparticle more than in the case where the first inorganic layer was formed alone, which suppressed degradation of the performance of the semiconductor nanoparticle.

The luminescence intensity of the light-emitting device that included the wavelength conversion unit prepared in Production Example 18 was 90% after a lapse of 30 minutes and 80% after a lapse of 60 minutes. In Production Example 18, the $Al_2O_3$ inorganic crystals formed on the first inorganic layer of the semiconductor phosphor nanoparticle reduced the amount of ultraviolet radiation that reached the semiconductor nanoparticle more than in the case where the first inorganic layer was formed alone, which suppressed degradation of the performance of the semiconductor nanoparticle.

It should be understood that the above-described embodiments and examples are intended to be illustrative and not restrictive in all respects. The scope of the present disclosure is indicated by the appended claims, rather than the foregoing description, and all changes that come within the meaning and range of equivalence thereof are intended to be embraced therein.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2013-242530 filed in the Japan Patent Office on Nov. 25, 2013, the entire contents of which are hereby incorporated by reference.

What is claimed is:

1. A semiconductor phosphor nanoparticle comprising:
   a semiconductor nanoparticle; and
   a first organic compound,
   wherein an end of the first organic compound is bonded to a surface of the semiconductor nanoparticle,
   wherein another end of the first organic compound is polymerized to form a first inorganic layer,
   wherein the first organic compound includes a hydrocarbon chain, and
   wherein the end of the first organic compound bonded to the surface of the semiconductor nanoparticle is an amino group, a thiol group, or a phosphoryl group.

2. The semiconductor phosphor nanoparticle according to claim 1,
   wherein the first inorganic layer is composed of a silicon oxide or a metal oxide.

3. The semiconductor phosphor nanoparticle according to claim 1,
   wherein a second organic compound is bonded to the surface of the semiconductor nanoparticle, the second organic compound having a shorter main chain than the first organic compound.

4. The semiconductor phosphor nanoparticle according to claim 1,
   wherein a second inorganic layer is formed on an outer surface of the first inorganic layer.

5. The semiconductor phosphor nanoparticle according to claim 1,
   wherein an inorganic crystal is formed on an outer surface of the first inorganic layer.

* * * * *